(12) United States Patent
Tan

(10) Patent No.: US 11,239,140 B2
(45) Date of Patent: Feb. 1, 2022

(54) CHIP PACKAGING STRUCTURE WITH HEAT DISSIPATION LAYER, FLANGE AND SEALING PIN

(71) Applicant: Hefei SMAT Technology Co., LTD, Hefei (CN)

(72) Inventor: Xiaochun Tan, Hefei (CN)

(73) Assignee: HEFEI SMAT TECHNOLOGY CO., LTD., Hefei (CN)

( * ) Notice: Subject to any disclaimer, the term of this patent is extended or adjusted under 35 U.S.C. 154(b) by 215 days.

(21) Appl. No.: 16/227,861

(22) Filed: Dec. 20, 2018

(65) Prior Publication Data

US 2019/0189541 A1 Jun. 20, 2019

(30) Foreign Application Priority Data

Dec. 20, 2017 (CN) .......................... 201711387769.3

(51) Int. Cl.
*H01L 23/49* (2006.01)
*H01L 23/31* (2006.01)
(Continued)

(52) U.S. Cl.
CPC .......... *H01L 23/49* (2013.01); *H01L 21/4853* (2013.01); *H01L 21/4882* (2013.01);
(Continued)

(58) Field of Classification Search
CPC ... H01L 23/49; H01L 23/3107; H01L 23/367; H01L 23/3736; H01L 23/4334; H01L 23/49811; H01L 23/49838; H01L 21/4853; H01L 21/4882; H01L 21/4889; H01L 21/56; H01L 21/568; H01L 21/6835;
(Continued)

(56) References Cited

U.S. PATENT DOCUMENTS 5,206,713 A * 4/1993 McGeary .............. H01L 23/367
257/684
5,652,461 A * 7/1997 Ootsuki .................. H01L 24/49
257/675
(Continued)

FOREIGN PATENT DOCUMENTS

CN 106057685 A 10/2016
CN 205920961 U 2/2017
(Continued)

*Primary Examiner* — Lex H Malsawma
(74) *Attorney, Agent, or Firm* — Westman, Champlin & Koehler, P.A.

(57) ABSTRACT

Disclosed a chip packaging structure and a manufacturing method thereof. The chip packaging structure comprises: a metal heat dissipation layer; a chip structure comprising a plurality of first electrical contacts on an upper surface of the chip structure; a pin layer comprising a plurality of second electrical contacts and a plurality of separate metal bumps; an encapsulant encapsulating at least one portion of the chip structure, the metal heat dissipation layer and the pin layer, wherein at least one portion of the pin layer is exposed to an upper surface of the encapsulant, and an lower surface of the metal heat dissipation layer is exposed outside the encapsulant. The metal heat dissipation layer includes a flange on the side surface for tightly combining the metal heat dissipation layer and the encapsulant.

9 Claims, 10 Drawing Sheets

(51) Int. Cl.
*H01L 23/367* (2006.01)
*H01L 23/373* (2006.01)
*H01L 21/56* (2006.01)
*H01L 23/498* (2006.01)
*H01L 21/48* (2006.01)
*H01L 21/683* (2006.01)
*H01L 23/433* (2006.01)

(52) U.S. Cl.
CPC .......... *H01L 21/4889* (2013.01); *H01L 21/56* (2013.01); *H01L 21/568* (2013.01); *H01L 21/6835* (2013.01); *H01L 23/3107* (2013.01); *H01L 23/367* (2013.01); *H01L 23/3736* (2013.01); *H01L 23/4334* (2013.01); *H01L 23/49811* (2013.01); *H01L 23/49838* (2013.01); *H01L 2221/68359* (2013.01); *H01L 2224/04105* (2013.01); *H01L 2224/18* (2013.01); *H01L 2224/32245* (2013.01); *H01L 2224/73267* (2013.01); *H01L 2224/92244* (2013.01); *H01L 2924/15153* (2013.01)

(58) Field of Classification Search
CPC . H01L 2221/68359; H01L 2224/04105; H01L 2224/18; H01L 2224/32245; H01L 2224/73267; H01L 2224/92244; H01L 2924/15153
See application file for complete search history.

(56) References Cited

U.S. PATENT DOCUMENTS

| | | | | |
|---|---|---|---|---|
| 6,521,480 | B1* | 2/2003 | Mitchell | H01L 21/56 257/E21.502 |
| 7,126,218 | B1* | 10/2006 | Darveaux | H01L 23/3128 257/706 |
| 2003/0011053 | A1* | 1/2003 | Yasunaga | H01L 23/4334 257/678 |
| 2004/0026776 | A1* | 2/2004 | Brand | H01L 23/4334 257/706 |
| 2006/0056213 | A1* | 3/2006 | Lee | H01L 25/162 363/144 |
| 2007/0029683 | A1* | 2/2007 | Tsai | H01L 23/4334 257/796 |
| 2007/0074850 | A1* | 4/2007 | Peschl | H01L 23/467 165/80.3 |
| 2008/0017977 | A1* | 1/2008 | Tseng | H01L 23/4334 257/712 |
| 2008/0073070 | A1* | 3/2008 | Kuo | H01L 23/3736 165/185 |
| 2008/0237898 | A1* | 10/2008 | Yano | H01L 23/3128 257/796 |
| 2012/0161301 | A1* | 6/2012 | Huang | H01L 24/19 257/666 |
| 2014/0240922 | A1* | 8/2014 | Watanabe | H04M 1/0202 361/679.54 |
| 2015/0021750 | A1* | 1/2015 | Fujino | H01L 23/3675 257/667 |
| 2015/0187675 | A1* | 7/2015 | Tang | H01L 23/367 257/712 |
| 2015/0187679 | A1* | 7/2015 | Ho | H01L 23/367 257/690 |
| 2015/0257249 | A1* | 9/2015 | Kim | H05K 1/0204 361/700 |
| 2017/0127567 | A1* | 5/2017 | Besancon | H01L 23/4334 |
| 2017/0287805 | A1* | 10/2017 | Ozawa | H01L 23/3114 |
| 2017/0309571 | A1* | 10/2017 | Yi | H01L 24/20 |
| 2018/0175011 | A1* | 6/2018 | Sung | H01L 23/5381 |
| 2019/0067207 | A1* | 2/2019 | Hu | H01L 23/49866 |
| 2019/0371731 | A1* | 12/2019 | Kang | H01L 23/3128 |

FOREIGN PATENT DOCUMENTS

| | | |
|---|---|---|
| CN | 108010889 A | 5/2018 |
| CN | 108281397 A | 7/2018 |
| CN | 207781576 U | 8/2018 |
| CN | 207800585 U | 8/2018 |
| CN | 207800586 U | 8/2018 |

* cited by examiner

CHIP PACKAGING STRUCTURE WITH HEAT DISSIPATION LAYER, FLANGE AND SEALING PIN

CROSS-REFERENCE TO RELATED APPLICATION

This application claims priority to the Chinese Patent Application No. 201711387769.3, filed on Dec. 20, 2017, entitled "chip packaging structure and manufacturing method thereof", which is incorporated herein by reference in its entirety.

BACKGROUND OF THE DISCLOSURE

Field of the Disclosure

The present disclosure relates to the semiconductor field, and more particularly, to a chip packaging structure and a manufacturing method thereof.

Background of the Disclosure

In a chip structure according to the prior art, a wire-bonding structure or a flip-chip structure is generally used for packaging, and since there is no design for heat dissipation therein, the contact between chips and environment outside the chips becomes a natural heat dissipation path. However, with the progress of science and technology, advanced processes make it possible to produce smaller chips with more complex functions, and as a result, the spaces between pins of the chip packages must be reduced accordingly. Relatively, each pin has to withstand more thermal energy, which is generated by chip operations. After a long-term operation, a large amount of thermal energy is accumulated on the pins, which will damage normal operations of the chips. A typical damage is caused by a phenomenon called electron migration, which is prone to occur on the pins. In addition, the packaging and manufacturing processes by use of the wire-bonding structure or the flip-chip structure is complex, which results in relatively high manufacturing cost.

Therefore, for the process of semiconductor technology, it is essential to provide a chip packaging structure with high heat-dissipation efficiency, which can be made by simple manufacturing process.

SUMMARY OF THE DISCLOSURE

The present disclosure has solved the problem by providing a chip packaging structure and a manufacturing method thereof, wherein a pin layer or a redistribution layer is formed by using a pattern plating process, so that on the premise that the performance of the chip packaging structure is guaranteed, the manufacturing process is simplified and the manufacturing cost is reduced.

According to one aspect of the disclosure, there is provided a chip packaging structure comprising: a metal heat dissipation layer; a chip structure located on an upper surface of the metal heat dissipation layer and comprising a plurality of first electrical contacts on an upper surface of the chip structure; a pin layer comprising a plurality of second electrical contacts and a plurality of separate metal bumps, wherein the plurality of second electrical contacts are located on lower surfaces of the plurality of metal bumps, and the plurality of second electrical contacts are coupled to the plurality of first electrical contacts of the chip structure through a plurality of conductive pillars; and an encapsulant encapsulating at least one portion of the chip structure, the metal heat dissipation layer and the pin layer, wherein at least one portion of the pin layer is exposed to an upper surface of the encapsulant, and a lower surface of the metal heat dissipation layer is exposed outside the encapsulant.

Preferably, the metal heat dissipation layer comprises a flange on its side surface.

Preferably, the flange of the metal heat dissipation layer extends in a direction perpendicular to the side surface of the metal heat dissipation layer and the flange is located inside the encapsulant.

Preferably, the flange of the metal heat dissipation layer extends in a direction parallel to the side surface of the metal heat dissipation layer and the flange is configured to surround the side surface of the metal heat dissipation layer.

Preferably, the chip packaging structure further comprises a sealing pin located on an upper surface of the flange and extending to a periphery of the upper surface of the encapsulant, so that, the metal heat dissipation layer, the flange and the sealing pin form a cavity for housing the encapsulant.

Preferably, an upper surface of the sealing pin and an upper surface of the pin layer are at a same height.

Preferably, the chip packaging structure further comprises a redistribution layer located between the chip structure and pin layer, wherein the redistribution layer extends in a direction parallel to the upper surface of the chip structure, the distribution layer is configured to couple the plurality of first conductive contacts located at a center of the upper surface of the chip structure to the plurality of second electrical contacts of the pin layer through the plurality of conductive pillars, and the plurality of second electrical contacts are located above a center of the chip structure, or above an edge of the chip structure.

Preferably, the plurality of conductive pillars comprise: first conductive pillars configured to electrically couple a lower surface of the redistribution layer to the chip structure; and second conductive pillars configured to electrically couple an upper surface of the redistribution layer to a lower surface of the pin layer.

Preferably, the chip packaging structure further comprises an insulating layer located on the lower surface of the metal heat dissipation layer.

Preferably, the upper surface of the metal heat dissipation layer is connected with the chip structure through an adhesive layer.

Preferably, the encapsulant comprises a first encapsulant and a second encapsulant, the second encapsulant is located on the first encapsulant, the first encapsulant encapsulates the chip structure and the metal heat dissipation layer, and the second encapsulant encapsulates the redistribution layer.

According to another aspect of the disclosure, there is provided a manufacturing method for a chip packaging structure comprising: arranging a metal heat dissipation layer on a substrate, wherein the metal heat dissipation layer comprises a flange on its side surface; attaching a chip structure on an upper surface of the metal heat dissipation layer by using an adhesive layer; forming an encapsulant encapsulating an upper surface of the substrate, the metal heat dissipation layer, the chip structure and a plurality of electrode connection structures; performing mechanical or chemical treatment, to make upper surfaces of the plurality of electrode connecting structures exposed outside the first encapsulant; and arranging a pin layer for electrically coupling to and covering the upper surfaces of the plurality of electrode connection structures.

Preferably, the flange of the metal heat dissipation layer extends perpendicular to the side surface of the metal heat dissipation layer.

Preferably, the step of arranging a pin layer for electrically coupling to and covering the upper surfaces of the plurality of the electrode connection structures comprises: forming a first encapsulant for encapsulating the upper surface of the substrate, the metal heat dissipation layer, the chip structure, and the plurality of electrode connection structures, and exposing the upper surfaces of the plurality of the electrode connection structures; forming a redistribution layer by using a pattern plating process, and coupling the redistribution layer to the upper surfaces of the plurality of electrode connection structures; forming a second encapsulant for encapsulating the redistribution layer; performing perforation or etching, so that at least one portion of an upper surface of the redistribution layer is exposed outside the second encapsulant; and arranging the pin layer for electrically coupling to and covering the exposed portion of the upper surface of the redistribution layer by using a pattern plating process.

Preferably, the flange of the metal heat dissipation layer extends in a direction parallel to the side surface of the metal heat dissipation layer.

Preferably, the manufacturing method comprises: forming the encapsulant for encapsulating the upper surface of the substrate, the metal heat dissipation layer, the chip structure, and the plurality of electrode connection structures, and exposing the upper surfaces of the plurality of electrode connection structures and the upper surface of the flange; and arranging the pin layer for electrically coupling to and covering the upper surfaces of the plurality of electrode connection structures, and arranging a sealing pin for coupling to and covering the upper surface of the flange.

Preferably, the manufacturing method further comprises: forming a first encapsulant for encapsulating the upper surface of the substrate, the metal heat dissipation layer, the chip structure and the plurality of electrode connection structures, and exposing the upper surfaces of the plurality of electrode connection structures and the upper surface of the flange; forming a redistribution layer coupling the redistribution layer to the upper surfaces of plurality of the electrode connection structures by a pattern plating process, and making the flange grow; forming a second encapsulant for encapsulating the redistribution layer and the flange; performing perforation or etching, so that, at least one portion of an upper surface of the redistribution layer and the upper surface of the flange is exposed outside the second encapsulant; arranging the pin layer for electrically coupling to and covering an exposed portion of the redistribution layer, making the flange re-grow, and forming the sealing pin for coupling to and covering the upper surface of the flange, by using a pattern plating process.

Preferably, the manufacturing method further comprises arranging a sealing pin on the upper surface of the flange, the upper surface of the flange and the upper surface of the redistribution layer are at a same height, and an upper surface of the sealing pin and an upper surface of the pin layer are at a same height.

Preferably, the manufacturing method further comprises: removing the substrate and forming an insulating layer on a lower surface of the metal heat dissipation layer.

According to the chip packaging structure of the present disclosure, the pin layer or the redistribution layer are formed by adopting a pattern plating process, and on the premise that the performance of the chip packaging structure is guaranteed, the manufacturing process can be simplified and the manufacturing cost can be reduced. By exposing at least one portion of the metal heat dissipation layer located below the chip structure outside the encapsulant, the heat dissipation performance of the entire chip packaging structure is improved. Extending the redistribution layer in a direction parallel to the upper surfaces of the chip structures is equivalent to increasing a layout area of the electrodes of chip. The electrodes of chip are led above the edge of the chip structure so that the spaces between the external pins are increased. As a result, the abnormal accidents, such as contacts causing a failure on the chip packaging structure, are less likely to happen.

According to one embodiment of the disclosure, the metal heat dissipation layer comprises the flange extending in a direction perpendicular to the side surface of the metal heat dissipation layer, so that the surface area of the metal heat dissipation layer is increased, which can not only further improve the heat dissipation performance of the chip packaging structure, but also enhance the combination force between the metal heat dissipation layer and the encapsulant.

According to another embodiment of the disclosure, the metal heat dissipation layer comprises the flange extending in a direction parallel to the side surface of the metal heat dissipation layer, the flange is configured to surround the side surface of the encapsulant, the metal heat dissipation layer, the flange and the sealing pin form the cavity accommodating the encapsulant, which can not only further improve the heat dissipation performance of the chip packaging structure, but also enhance the combination force between the metal heat dissipation layer and the encapsulant. In addition, a sealing ring formed by the metal heat dissipation layer, the flange and the sealing layer has a good electromagnetic shielding performance, and a good airtightness performance. In applications requiring electromagnetic shielding, the chip packaging structure can be widely used to replace metal cans and ceramic packages in the prior art.

BRIEF DESCRIPTION OF THE DRAWINGS

The above and other objects, advantages and features of the present disclosure will become more fully understandable from the detailed description given hereinbelow in connection with the appended drawings, and wherein.

DETAILED DESCRIPTION OF THE DISCLOSURE

Figure 1A:
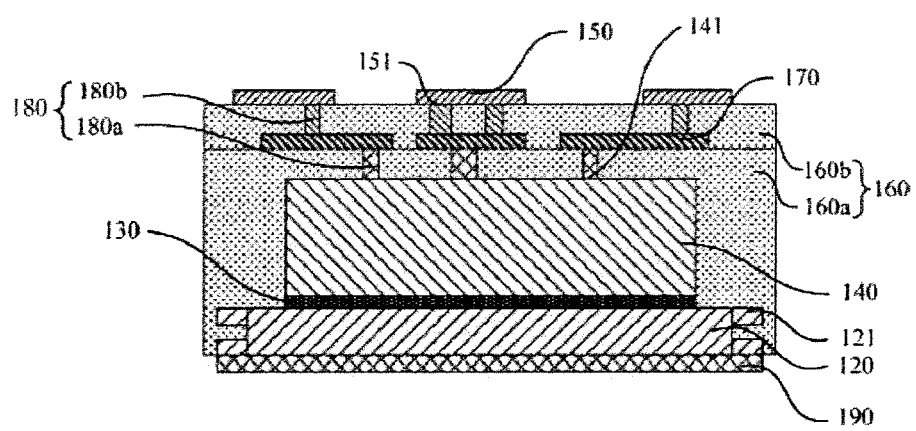
FIG. 1a shows a cross-sectional diagram of a chip packaging structure according to a first embodiment of the present disclosure.

Exemplary embodiments of the present disclosure will be described in more details below with reference to the accompanying drawings. In the drawings, like reference numerals denote like members. The figures are not drawn to scale, for the sake of clarity. In addition, some well-known parts may not be shown in the figures.

Many specific details of the present disclosure are described below, such as the structures, materials, dimensions, processes, and techniques of the parts, in order to more clearly understand the present disclosure. However, one skilled in the art will understood that the present disclosure may be practiced without these specific details.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" or "adjoin" another layer or region, there are not intervening layers or regions present. In the present application, when one region is referred to as being "directly in", it can be directly in another region and adjoins another region, but not in an implantation region of another region.

In the present application, the term "semiconductor structure" means generally the whole semiconductor structure formed at each step of the method for manufacturing the semiconductor device, including all of the layers and regions having been formed. The term of "laterally extending" is referring to extending in a direction substantially perpendicular to the depth direction of the groove.

Many specific details of the present disclosure are described below, such as the structures, materials, dimensions, processes, and techniques of the parts, in order to more clearly understand the present disclosure. However, one skilled in the art will understood that the present disclosure may be practiced without these specific details.

The present disclosure may be presented in various forms, some of which will be described below.

FIG. 1a shows a cross-sectional diagram of a chip packaging structure according to a first embodiment of the present disclosure.

As shown in FIG. 1a, a chip structure 140 is located on an upper surface of a metal heat dissipation layer 120, and the chip structure 140 is attached to the upper surface of the metal heat dissipation layer 120 by using an adhesive layer 130. The chip structure 140 comprises a plurality of first electrical contacts 141 on the upper surface of the chip structure 140. A redistribution layer 170 is located over the chip structure 140 and is electrically coupled to the first electrical contacts 141 of the chip structure 140 by using a plurality of conductive pillars 180. A pin layer 150 is located on the redistribution layer 170. The pin layer 150 includes a plurality of metal bumps and a plurality of second electrical contacts 151. The plurality of second electrical contacts 151 are located below lower surfaces of the plurality of metal bumps. The plurality of second electrical contacts 151 are electrically coupled to the upper surface of the redistribution layer 170 by using the plurality of conductive pillars 180. The redistribution layer 170 extends in a direction parallel to the upper surface of the chip structure 140. The redistribution layer 170 is configured to couple the first electrical contacts 141 located at the center of the upper surface of the chip structure 140 to the second electrical contacts 151 of the pin layer 150 through the conductive pillars 180. The second conductive contacts 151 are located above the center of the chip structure 140 or above the edge of the chip structure 140. The plurality of conductive pillars 180 includes first conductive pillars 180a and second conductive pillar 180b.

The first conductive pillars 180a is configured to electrically couple the lower surface of the redistribution layer 170 to the chip structure 140, and the second conductive pillars 180b is configured to electrically couple the upper surface of the redistribution layer 170 to the lower surface of the pin layer 150. An encapsulant 160 encapsulates chip structure 140, the metal heat dissipation layer 120, the redistribution layer 170 and at least one portion of pin layer 150. At least one portion of the pin layer 150 is exposed to the upper surface of the encapsulant 160, and the lower surface of the metal heat dissipation layer 120 is exposed outside the encapsulant 160. Specifically, the encapsulant 160 includes a first encapsulant 160a and a second encapsulant 160b. The second encapsulant 160b is located on the first encapsulant 160a. The first encapsulant 160a encapsulates chip structure 140 and at least one portion of metal heat dissipation layer 120. The second encapsulant 160b encapsulates the redistribution layer 170.

Extending the redistribution layer 170 in a direction parallel to the upper surface of the chip structure, the layout area of the electrodes of chip is equivalent to be increased. The electrodes of chip are led above the edge of the chip structure 140 so that the spaces between the external pins are increased. As a result, the abnormal accidents, such as contacts causing a failure on the chip packaging structure, are less likely to happen.

The redistribution layer 170 in the present embodiment is an alternative structure. If the redistribution layer 170 is not provided in the embodiment, the chip structure 140 can be directly and electrically coupled to the second electrical contacts 151 of the pin layer 150 through the plurality of conductive pillars 180.

The metal heat dissipation layer 120 includes a flange 121 on its side surface. The flange 121 extends in a direction perpendicular to the side surface of the metal heat dissipation layer 120. The flange 121 is located in the encapsulant 160 and is used for tightly combining the metal heat dissipation layer 120 and the encapsulant 160 with each other. In the embodiment, the flange 121 of the metal heat dissipation layer 120 can be two, which can be distributed up and down, and a groove is formed between the two flanges 121. The groove can be filled with the encapsulant 160 to further improve the heat dissipation of the chip packaging structure and enhance the combination between the metal heat dissipation layer 120 and the encapsulant 160.

FIGS. 1b to 1j show cross-sectional diagrams of various stages of a manufacturing method for the chip package structure according to the first embodiment of the present disclosure.

Figure 1B:
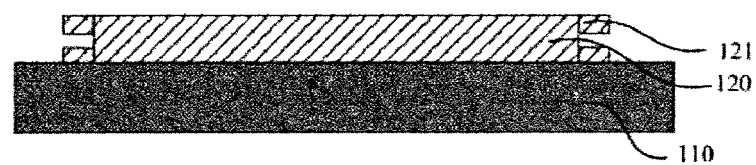
FIGS. 1b to 1j show cross-sectional diagrams of various stages of a manufacturing method for the chip package structure according to the first embodiment of the present disclosure.

As shown in FIG. 1b, the metal heat dissipation layer 120 is attached to the upper layer of the substrate 110 by using the adhesive layer. The metal heat dissipation layer 120 includes the flange 121 on the side surface. The flange 121 extends in a direction perpendicular to the side surface of the metal heat dissipation layer 120. The extension length of the flange 121 is not beyond the side surface of the substrate 110. The metal heat dissipation layer 120 in the embodiment may be made of copper, aluminum, or other suitable materials.

Figure 1C:
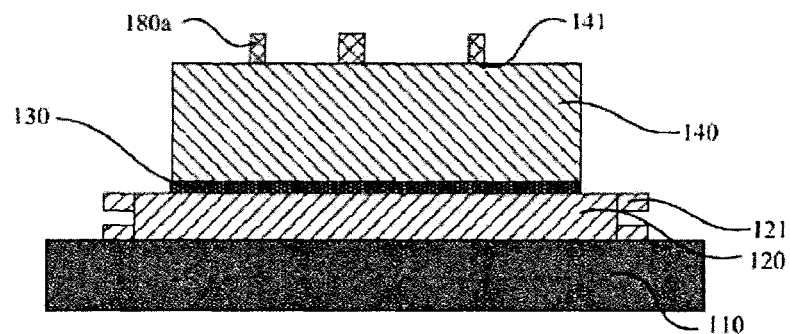

Next, as shown in FIG. 1c, the chip structure 140 is attached to the upper surface of the metal heat dissipation layer 120 by using the adhesive layer 130. The upper surface of the chip structure 140 has a plurality of electrode connection structures for leading out the electrodes of chip. The structure and components of the electrode connection structures can take a variety of forms. In the present embodiment, the electrode connection structures include a plurality of first electrical contacts 141 on the upper surface and a plurality of first conductive pillars 180 arranged on the first electrical contacts 141. The adhesive layer 130 may be made of an insulating adhesive material, for example, epoxy resin. The insulating adhesive material can be added on the metal heat dissipation layer 120 by using a dispensing process to form an epoxy resin with a certain thickness to ensure the chip performance. The adhesive layer 130 may also be made of a conductive adhesive material, which be electrically connected to the metal heat dissipation layer 120, and has good heat dissipation.

Figure 1D:
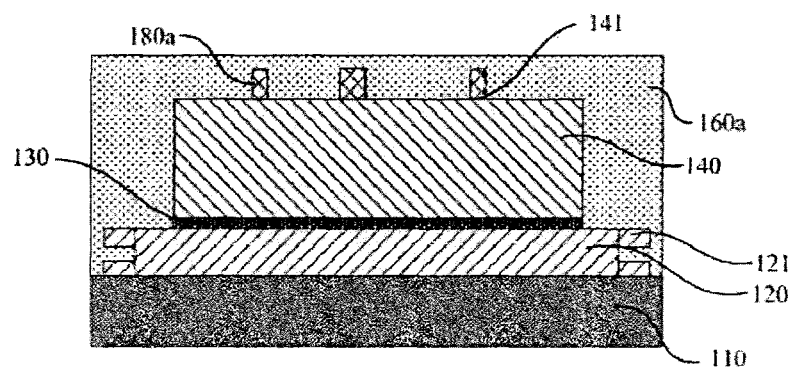

Next, as shown in FIG. 1d, the first encapsulant 160a is formed to encapsulate the upper surface of the substrate 110, the metal heat dissipation layer 120, the chip structure 140, and the plurality of first conductive pillars 180a. The material of the first encapsulant 160a may be polyimide, silicone or epoxy, or other suitable material. The first encapsulant 160a may be made by a compression molding process, a transfer molding process, a liquid sealing molding process, or other suitable process.

Figure 1E:
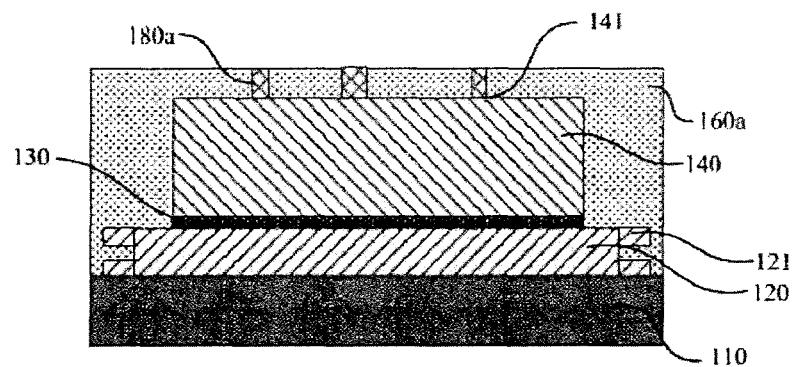

Next, as shown in FIG. 1e, the upper surfaces of the plurality of first conductive pillars 180a located on the upper surface of the chip structure 140 are exposed to the upper surface of the first encapsulant 160a by a mechanical process such as grinding or drilling, and the upper surfaces of the plurality of first conductive pillars 180a and the upper surface of the first encapsulant 160a are located in a same plane.

Figure 1F:
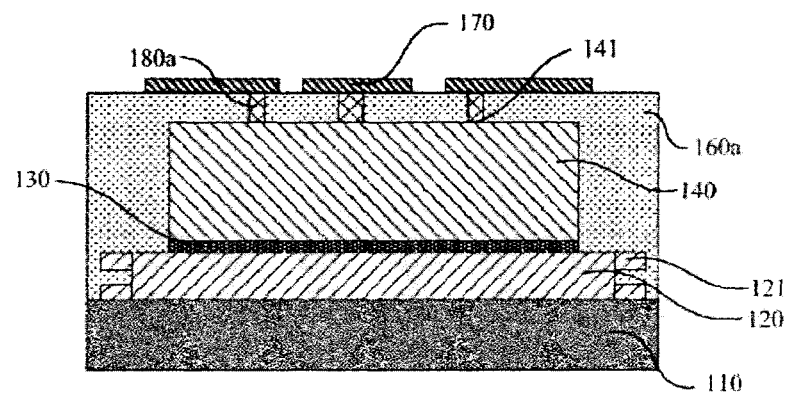

Next, as shown in FIG. 1f, the redistribution layer 170 is formed on the upper surfaces of the plurality of first conductive pillars 180a and the upper surface of the first encapsulant 160a by a pattern plating process or other suitable process, so that the chip structure 140 is electrically coupled to the lower surface of the redistribution layer 170 through the plurality of first conductive pillars 180a. Alternatively, the pin layer is formed on the upper surfaces of the plurality of first conductive pillars 180a and the upper surface of the first encapsulant 160a by a pattern plating process or other suitable process, so that the chip structure 140 is electrically coupled to the pin layer through the plurality of first conductive pillars 180a. The step of pattern plating process includes: firstly, a first metal layer is formed on the upper surfaces of the plurality of first conductive pillars 180a and the upper surface of the first encapsulant 160a by using a deposition process, and then a second metal layer is formed on the first metal layer by using an electroplating process.

Figure 1G:
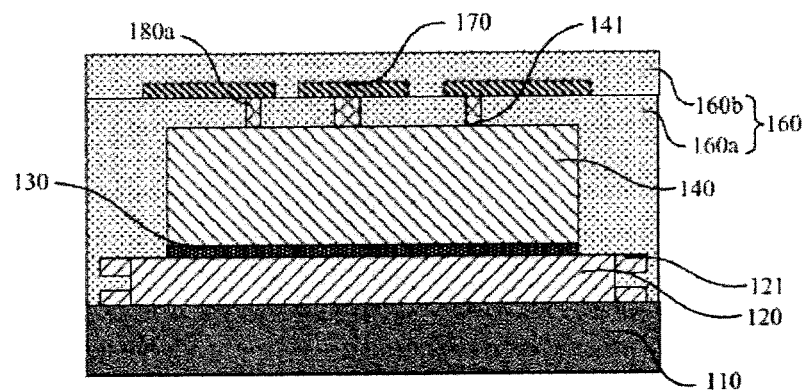

Next, as shown in FIG. 1g, the second encapsulant 160b is formed to encapsulate the redistribution layer 170. The second encapsulant 160b is located on the first encapsulant 160a. The first encapsulant 160a and the second encapsulant 160b form the encapsulant 160. The first encapsulant 160a and the second encapsulant 160b may be made of a same material.

Figure 1H:
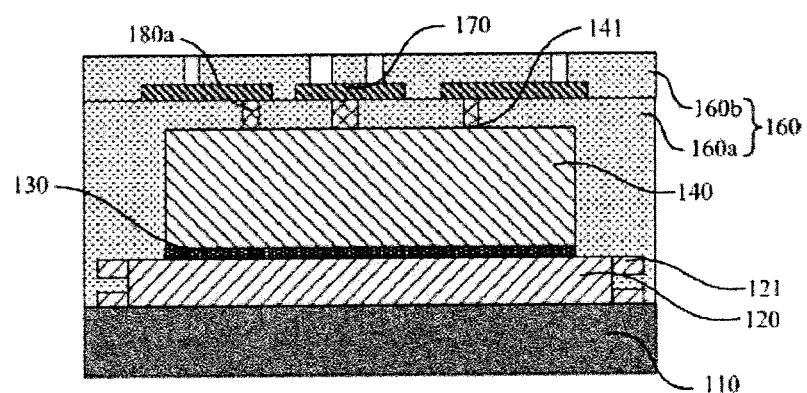

Next, as shown in FIG. 1h, at least one portion of the upper surface of the redistribution layer 170 is exposed outside the second encapsulant 160b by drilling or etching, and the upper surface of the second encapsulant 160b is higher than the upper surface of the redistribution layer 170.

Figure 1I:
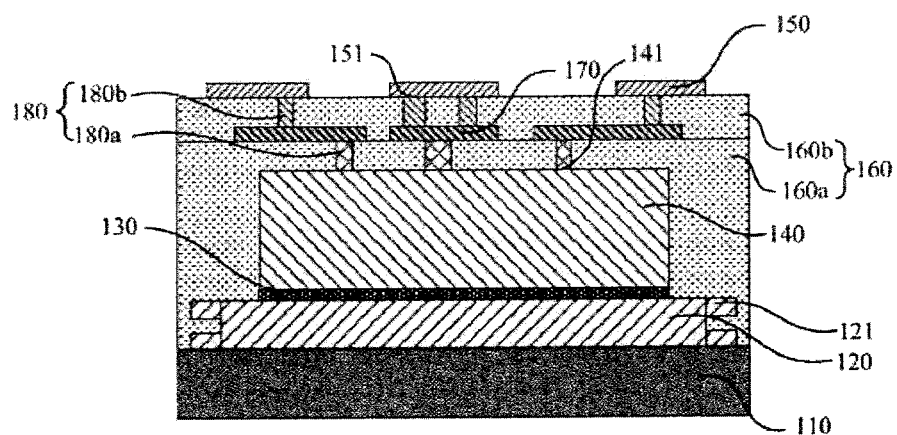

Next, as shown in FIG. 1i, the second conductive pillars 180b and the pin layer 150 are formed at the same time by a process such as the above-mentioned pattern plating process or the like. The pin layer 150 is located on the second conductive pillars 180b. The second conductive pillars 180b are located inside a through-hole of the second encapsulant 160b and are coupled to the exposed portion of the upper surface of the redistribution layer 170 by the second encapsulant 160b, so that the chip structure 140 is electrically coupled to the pin layer 150 through the redistribution layer 170. The pin layer 150 may be made of a plurality of separate metal bumps.

Figure 1J:
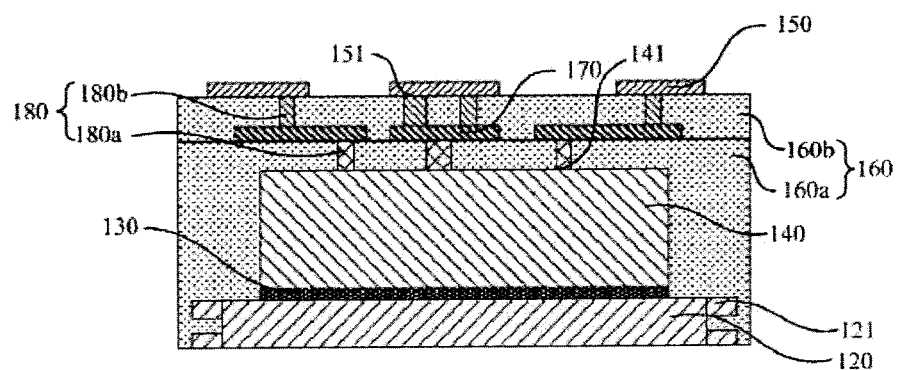

Next, as shown in FIG. 1j, the substrate 110 and the adhesive layer between the substrate 110 and the metal heat dissipation layer 120 are removed, so that the lower surface of the metal heat dissipation layer 120 is exposed outside the first encapsulant 160a.

Next, as shown in FIG. 1a, insulation layer 190 is formed on the lower surface of the metal heat dissipation layer 120 by using chemical treatment or physical coating, such as vapor deposition. The insulation layer 190 is used to electrically insulate the lower surface of the metal heat dissipation layer 120, to prevent static electrons from generating and it is made of a material having a good thermal conductivity, for example, it may be made of polyimide, silicone or epoxy resin, or other suitable material.

In the first embodiment of the present disclosure, the metal heat dissipation layer 120 arranges the flange extending in a direction perpendicular to the side surface of the metal heat dissipation layer 120, so that the surface area of the metal heat dissipation layer 120 is increases, which can not only further improve the heat dissipation of the chip packaging structure, but also enhance the combination force between the metal heat dissipation layer 120 and the encapsulant 160.

Figure 2A:
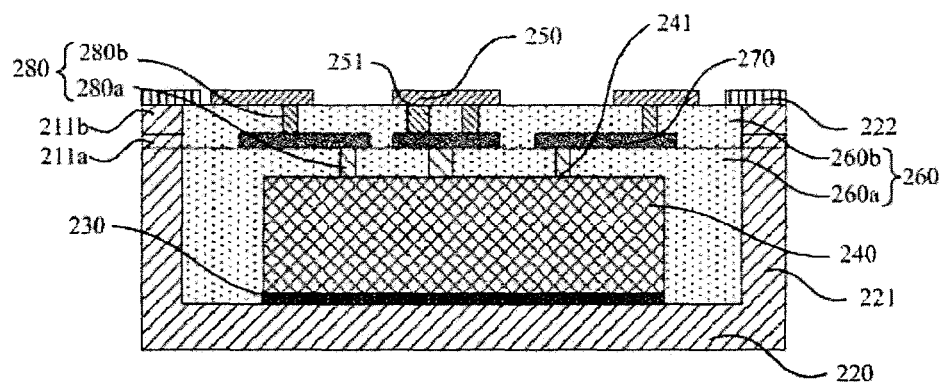
FIG. 2a shows a cross-sectional diagram of a chip package structure according to a second embodiment of the present disclosure.

FIG. 2a shows a cross-sectional diagram of a chip package structure according to a second embodiment of the present disclosure.

Referring to FIG. 2a, a chip structure 240 is located on an upper surface of a metal heat dissipation layer 220, and the chip structure 240 is attached to the upper surface of the metal heat dissipation layer 220 by using an adhesive layer 230. The chip structure 240 includes a plurality of first electrical contacts 241 on the upper surface of the chip structure 240. A redistribution layer 270 is located on the chip structure 240 and is electrically coupled to the first electrical contacts 241 of the chip structure 240 through a plurality of conductive pillars 280. A pin layer 250 is on the redistribution layer 270. The pin layer 250 includes a plurality of metal bumps and a plurality of second electrical contacts 251. The plurality of second electrical contacts 251 are located below lower surfaces of the plurality of metal bumps. The second electrical contacts 251 are electrically coupled to the upper surface of the redistribution layer 270 through the plurality of conductive pillars 280. The redistribution layer 270 extends in a direction parallel to the upper surface of the chip structure 240. The redistribution layer 270 couple the first electrical contact 241 located on the center of the upper surface of the chip structure 240 to the second electrical contacts 251 of the pin layer located at the center and/or the edge of the upper surface of the chip structure 240 through the conductive pillars 280. The plurality of conductive pillars 280 includes first conductive pillars 280a and second conductive pillars 280b. The first conductive pillars 280a is configured to electrically couple the lower surface of the redistribution layer 270 to the chip structure 240, and the second conductive pillar 280b is configured to electrically couple the upper surface of the redistribution layer 270 to the lower surface of the pin layer 250. The encapsulant 260 encaplates all of the entire chip structure 240, the upper surface of the metal heat dissipation layer 220, entire redistribution layer 270, and at least one portion of the pin layer 250. The encapsulant 260 may be located on the upper surface of the metal heat dissipation layer 220. The lower surface of the 220 is exposed outside the encapsulant 260, and at least one portion of the pin layer 250 is exposed to the upper surface of the encapsulant 260. Specifically, the encapsulant 260 includes a first encapsulant 260a and a second encapsulant 260b. Second encapsulant 260b is located on the first encapsulant 260a. The first encapsulant 260a encapsulates the chip structure 240, and the second encapsulant 260b encapsulates the redistribution layer 270.

Extending the redistribution layer 270 in a direction parallel to the upper surface of the chip structure 240 is equivalent to increasing the layout area of electrodes. The electrodes of chip are led above the edge of the chip structure 240 so that the spaces between the external pins are increased. Therefore, abnormal accidents, such as contacts causing a failure on the chip packaging structure, are less likely to happen.

The redistribution layer 270 in the present embodiment is an alternative structure. If the redistribution layer 270 is not provided in the embodiment, the chip structure 240 can be directly coupled to the second electrical contacts 251 of the pin layer 250 through the plurality of conductive pillars 280.

The metal heat dissipation layer 220 includes flanges 221 on the side surface. The flanges 221 are configured to extend in a direction parallel to the side surface of the metal heat dissipation layer 220 and surround the side surface of the encapsulant 260. Sealing pins 222 are located on the upper surface of the flanges 221 and extend to the periphery of the upper surface of the encapsulant 260. The upper surface of the sealing pins 222 and the upper surface of the pin layer 250 are at a same height. The metal heat dissipating layer 220, the flanges 221 and the sealing pins 222 form a cavity for accommodating encapsulant 260. The encapsulant 260 is located in the cavity, and the encapsulant 260 and one portion of the upper surface of the metal heat dissipation layer 220, the inner side surface of the flanges 221, and one portion of the lower surface of the sealing pins 222 are connected, thereby improving the heat dissipation performance of the chip package structure and enhancing the combination force between the metal heat dissipation layer 220 and the encapsulant 260. The sealing pins 222 and the flanges 221 of the metal heat dissipation layer 220 may be made of same material.

FIGS. 2b to 2i show cross-sectional diagrams of various stages of a manufacturing method for the chip package structure according to the second embodiment of the present disclosure.

Figure 2B:
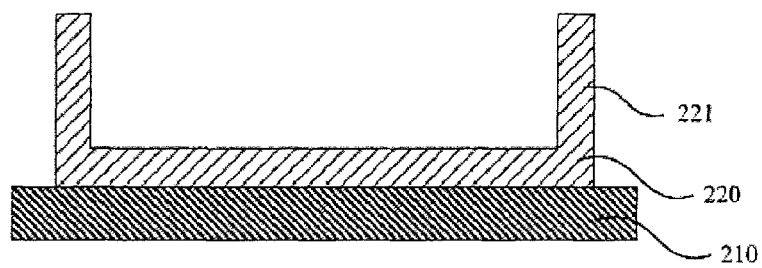
FIGS. 2b to 2i show cross-sectional diagrams of various stages of a manufacturing method for the chip package structure according to the second embodiment of the present disclosure.

As shown in FIG. 2b, the metal heat dissipation layer 220 is attached to the upper surface of the substrate 210 through an adhesive layer. The metal heat dissipation layer 220 includes the flanges 221 on the side surface. The flanges 221 are configured to extend in a direction parallel to the side surface of the metal heat dissipation layer 220, so that the metal heat dissipation layer 220 and the flanges 221 form a cavity. The metal heat dissipation layer 220 in the embodiment may be made of copper, aluminum, or other suitable materials.

Figure 2C:
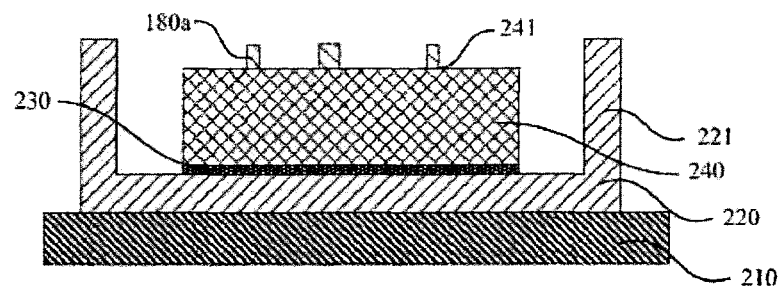

Next, as shown in FIG. 2c, the chip structure 240 is attached to the upper surface of the metal heat dissipation layer 220 through the adhesive layer 230. The chip structure 240 includes a plurality of first electrical contacts 241 on the upper surface, and a plurality of first conductive pillars 280a are arranged on the first electrical contacts 241. The upper surface of the first conductive pillars 280a and the upper surface of the flanges 221 are at a same height. The adhesive layer 230 may be made of an insulating adhesive material, for example, epoxy resin. The insulating adhesive material may be added on the metal heat dissipation layer 220 by using a dispensing process to form an epoxy resin with a certain thickness, so that the chip performance is ensured. The adhesive layer 230 may also be made of a conductive adhesive material, which is electrically coupled to the metal heat dissipation layer 220 for achieving good heat dissipation performance.

Figure 2D:
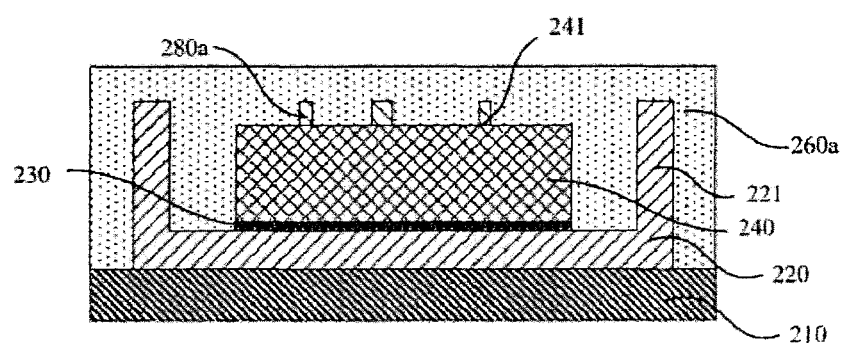

Next, as shown in FIG. 2d, the first encapsulant 260a is formed to encapsulate the upper surface of the substrate 210 and all of the metal heat dissipation layer 220, the chip structure 240, and the plurality of first conductive pillars 280a. The material of the first encapsulant 260a may be polyimide, silicone or epoxy resin, or other suitable material. The first encapsulant 260a may be made by a compression molding process, a transfer molding process, a liquid sealing molding process, or other suitable process.

Figure 2E:
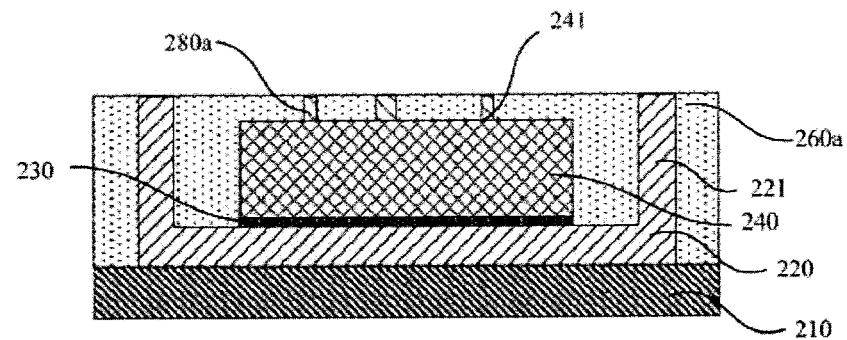

Next, as shown in FIG. 2e, the upper surfaces of the plurality of first conductive pillars 280a located on the upper surface of the chip structure 240 and the upper surface of the flanges 221 are exposed to the upper surface of the first encapsulant 260a by a mechanical process such as grinding or drilling. Preferably, the upper surfaces of the plurality of first conductive pillars 280a, the upper surface of the flanges 221, and the upper surface of the first encapsulant 260a are in a same plane.

Figure 2F:
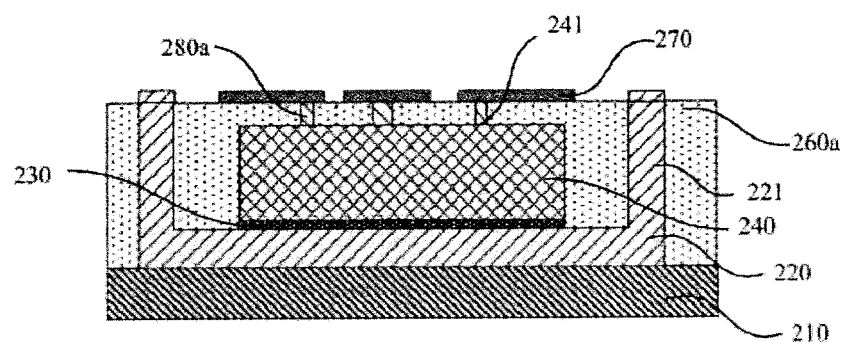

Next, as shown in FIG. 2f, the redistribution layer 270 is formed on the upper surfaces of the plurality of first conductive pillars 280a and the upper surface of the first encapsulant 260a by using a pattern plating process or other suitable process, so that the chip structure 240 is electrically coupled to the lower surface of the redistribution layer 270 through the plurality of first conductive pillars 280a. The flanges 221 are configured to grow by using the pattern plating process or other suitable process. Preferably, after growth the upper surface of the flange 221 and the upper surface of the redistribution layer 270 are at a same height. Alternatively, the pin layer is formed on the upper surfaces of the plurality of first conductive pillars 280a and the upper surface of the first encapsulant 260a by using the pattern plating process or other suitable method, so that the chip structure 240 is electrically coupled to the pin layer through the plurality of first conductive pillars 280a. The step of pattern plating process includes: firstly, a first metal layer is formed on the upper surfaces of the plurality of first conductive pillars 280a and the upper surface of the first encapsulant 260a through a deposition process; and then a second metal layer is formed on the first metal layer through an electroplating process.

Figure 2G:
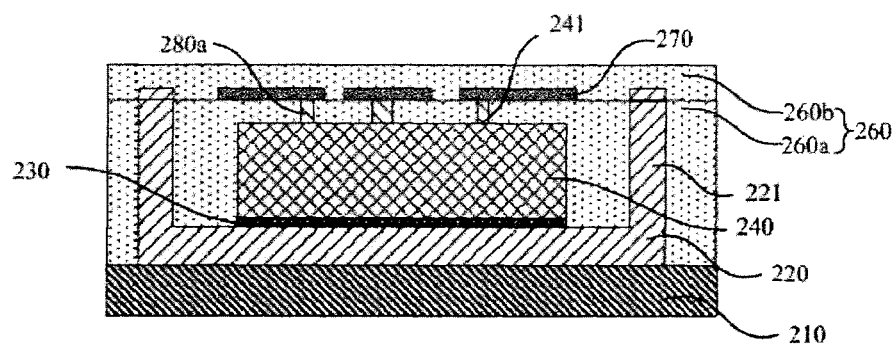

Next, as shown in FIG. 2g, the second encapsulant 260b is formed to encapsulate the redistribution layer 270 and the flanges 221. The second encapsulant 260b is located on the first encapsulant 260a. The first encapsulant 260a and the second encapsulant 260b form the encapsulant 260.

Figure 2H:
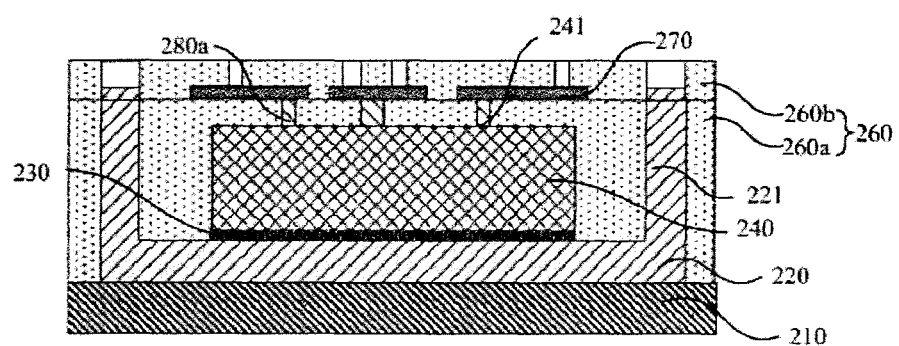

Next, as shown in FIG. 2h, a through-hole is formed in the second encapsulant by drilling or etching, so that at least one portion of the upper surface of the redistribution layer 270 and the upper surface of the flanges 221 are exposed outside the second encapsulant 260b, and the upper surface of the second encapsulant 260b is higher than the upper surface of the redistribution layer 270 and the upper surface of the flanges 221.

Figure 2I:
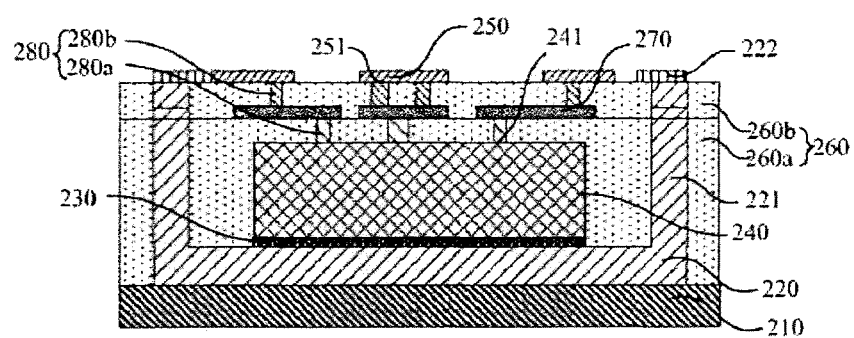

Next, as shown in FIG. 2i, the second conductive pillars 280b and the pin layer 250 are formed at the same time by the above-mentioned processes such as the pattern plating process. The pin layer 250 is located on the second conductive pillars 280b. The second conductive pillars 280b are located in the through-hole of the second encapsulant 260b and are coupled to the exposed portion of the upper surface of the redistribution layer 270 outside the second encapsulant 260b, so that the chip structure 240 is electrically coupled to the pin layer 250 through the redistribution layer 270. The pin layer 250 may be formed of a plurality of separate metal bumps. The flanges 221 are configured to grow again by using a pattern plating process or other suitable process. Preferably, after re-growth, the upper surface of flanges 221, the upper surfaces of the second encapsulant 260b and the second conductive pillars 280b are at a same height. The sealing sealing pins 222 are formed on the upper surface of the flange 221 and extends to the periphery of the upper surface of the encapsulant 260. The upper surface of the sealing pin 222 and the upper surface of the pin layer 250 are at a same height. The metal heat dissipation layer 220, the flanges 221, and the sealing pins 222 form a cavity for accommodating the encapsulant 260. The encapsulant 260 is located in the cavity, and the encapsulant 260 is connected with one portion of the upper surface of the metal heat dissipation layer 220, the inner side surface of the flanges 221, and one portion of the lower surface of the sealing pins 222.

Next, as shown in FIG. 2a, the substrate 210, the adhesive layer between the substrate 210 and the metal heat dissipation layer 220, and the encapsulant 260 on the outer side surface of the flanges 221 are removed, so that the lower surface of the metal heat dissipation layer 220 and the outer side surface of the flanges 221 are exposed outside the encapsulant 260. A protective layer is formed on the lower surface of the metal heat dissipation layer 220 and the outer side surface of the flanges 221 by chemical treatment or physical coating, such as vapor deposition. The protective layer may be formed of an inert metal, such as Ni, Au, to prevent the exposed metal heat dissipation layer 220 and the flanges 221 from being oxidized.

In the second embodiment of the present disclosure, at the edge of the metal heat dissipation layer 220, the flanges 221 extends in a direction parallel to the side surface of the metal heat dissipation layer 220. The flanges 221 are configured to surround the side surface of the encapsulant 260. The metal heat dissipation layer 220, the flanges 221 and the sealing pins 222 form a cavity for accommodating encapsulant 260, which can further improve the heat dissipation performance, the electromagnetic shielding performance, and the airtightness of the chip package structure, and can strengthen the combination force between the metal heat dissipation layer 220 and the encapsulant 260. Therefore, the reliability of the chip product is improved, which can be widely used to replace metallic or ceramic package structures.

According to the chip packaging structure of the present disclosure, the pin layer or the distribution layer are formed by adopting the pattern plating process, and on the premise that the performance of the chip packaging structure is guaranteed, the manufacturing process can be simplified, so that the manufacturing cost is reduced. By exposing at least one portion of the metal heat dissipation layer below the chip structure outside the encapsulant, the heat dissipation performance of the entire chip packaging structure is improved. In addition, the chip packaging structure of the present embodiment is entirely sealed with a metal package, so that it has good-looking appearance and product reliability.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element. If there is no explicit limitation, the wording "comprise a/an . . . " does not exclude the fact that other elements can also be included together with the process, approach, article or apparatus relevant to the element.

Although various embodiments of the present disclosure are described above, these embodiments neither present all details, nor imply that the present disclosure is limited to these embodiments. Obviously, many modifications and changes may be made in light of the teaching of the above embodiments. These embodiments are presented and some details are described herein only for explaining the principle of the disclosure and its actual use, so that one skilled person can practice the present disclosure and introduce some modifications in light of the disclosure. The disclosure is intended to cover alternatives, modifications and equivalents that may be included within the spirit and scope of the disclosure as defined by the appended claims.

The invention claimed is:

1. A chip packaging structure, comprising:
a metal heat dissipation layer;
a chip structure located on an upper surface of said metal heat dissipation layer, comprising a plurality of first electrical contacts on an upper surface of said chip structure;
a pin layer comprising a plurality of second electrical contacts and a plurality of separate metal bumps, wherein said plurality of second electrical contacts are located on lower surfaces of said plurality of metal bumps, and said plurality of second electrical contacts are coupled to said plurality of first electrical contacts of said chip structure through a plurality of conductive pillars; and
an encapsulant, encapsulating at least one portion of said pin layer, said metal heat dissipation layer and said chip structure to expose said pin layer on an upper surface of said encapsulant, and to expose a lower surface of said metal heat dissipation layer outside said encapsulant,
wherein said metal heat dissipation layer comprises at least one flange on its side surface, a sealing pin is located on an upper surface of said at least one flange and extending to a periphery of said upper surface of said encapsulant, so that said metal heat dissipation layer, said at least one flange and said sealing pin form a cavity for accommodating said encapsulant,
wherein said at least one flange extends around a plurality of side surfaces of said encapsulant.

2. The chip packaging structure according to claim 1, wherein said at least one flange of said metal heat dissipation layer is configured to extend in a direction perpendicular to said side surface of said metal heat dissipation layer and said at least one flange is located inside the encapsulant.

3. The chip packaging structure according to claim 1, wherein said at least one flange of said metal heat dissipation layer is configured to extend in a direction parallel to said side surface of said metal heat dissipation layer and said at least one flange is configured to surround a side surface of said encapsulant.

4. The chip packaging structure according to claim 1, wherein an upper surface of said sealing pin and an upper surface of said pin layer are at a same height.

5. The chip packaging structure according to claim 1, further comprising:
a redistribution layer located between said chip structure and said pin layer, wherein said redistribution layer is configured to extend in a direction parallel to said upper surface of said chip structure, said distribution layer is configured to couple said plurality of first conductive contacts on said upper surface of said chip structure to said plurality of second electrical contacts of said pin layer through said plurality of conductive pillars, and said plurality of second electrical contacts are located above a center of said chip structure, or above an edge of said chip structure.

6. The chip packaging structure according to claim 5, wherein said plurality of conductive pillars comprising:
a first conductive pillars configured to electrically couple a lower surface of said redistribution layer to said chip structure; and
a second conductive pillars configured to electrically couple an upper surface of said redistribution layer to a lower surface of said pin layer.

7. The chip packaging structure according to claim 5, wherein said encapsulant comprises a first encapsulant and a second encapsulant, said second encapsulant is located on said first encapsulant, said first encapsulant encapsulates said chip structure, and said metal heat dissipation layer, and said second encapsulant encapsulates said redistribution layer.

8. The chip packaging structure according to claim 1, further comprising:
an insulation layer located on said lower surface of said metal heat dissipation layer, thus the insulation layer and the chip structure are located on opposite sides of the metal heat dissipation layer, respectively.

9. The chip packaging structure according to claim 1, wherein said upper surface of said metal heat dissipation layer is connected with said chip structure by an adhesive layer.

* * * * *